US010663546B2

(12) United States Patent
Forman et al.

(10) Patent No.: US 10,663,546 B2
(45) Date of Patent: May 26, 2020

(54) METHOD AND MAGNETIC RESONANCE APPARATUS FOR ACQUIRING DIAGNOSTIC MEASUREMENT DATA OF A HEART (71) Applicant: Siemens Healthcare GmbH, Erlangen (DE)

(72) Inventors: Christoph Forman, Erlangen (DE); Edgar Mueller, Heroldsbach (DE); Michaela Schmidt, Uttenreuth (DE); Jens Wetzl, Spardorf (DE)

(73) Assignee: Siemens Healthcare GmbH, Erlangen (DE)

( * ) Notice: Subject to any disclaimer, the term of this patent is extended or adjusted under 35 U.S.C. 154(b) by 159 days.

(21) Appl. No.: 15/881,471

(22) Filed: Jan. 26, 2018

(65) Prior Publication Data

US 2018/0217215 A1    Aug. 2, 2018

(30) Foreign Application Priority Data

Jan. 27, 2017    (DE) .......................... 10 2017 201 327

(51) Int. Cl.
*G01R 33/483*    (2006.01)
*G01R 33/44*    (2006.01)
(Continued)

(52) U.S. Cl.
CPC ....... *G01R 33/4833* (2013.01); *G01R 33/445* (2013.01); *G01R 33/482* (2013.01); *G01R 33/543* (2013.01); *G01R 33/567* (2013.01); *G01R 33/5608* (2013.01); *G01R 33/5613* (2013.01); *G01R 33/288* (2013.01);
(Continued)

(58) Field of Classification Search
CPC ............. G01R 33/4833; G01R 33/567; G01R 33/5613; G01R 33/482; G01R 33/445; G01R 33/5608; G01R 33/543; G01R 33/56325; G01R 33/5614; G01R 33/4822;
(Continued)

(56) References Cited

U.S. PATENT DOCUMENTS

2005/0258829 A1* 11/2005 Bieri .................. G01R 33/5613 324/307
2007/0055138 A1* 3/2007 Edelman ............ G01R 33/5611 600/411

(Continued)

OTHER PUBLICATIONS

Moghari, et al.: Free-breathing 3D Cine Whole-heart Magnetic Resonance Imaging using Compressed Sensing Parallel Image Reconstruction;: Proc. Intl. Soc. Mag. Reson. Med.; vol. 24; (2016); abstract No. 4242.

(Continued)

*Primary Examiner* — Patrick Assouad
*Assistant Examiner* — Haidong Zhang
(74) *Attorney, Agent, or Firm* — Schiff Hardin LLP (57) ABSTRACT In a method and magnetic resonance apparatus for recording diagnostic measurement data of a heart of an examination object, the magnetic resonance apparatus is operated by a control sequence wherein an RF pulse excites nuclear spins with a flip angle of at least 60°, the diagnostic measurement data are recorded in a coordinate system independent of the heart, and the basic magnetic field produced by the magnetic resonance apparatus is smaller than 1.0 tesla.

17 Claims, 3 Drawing Sheets (51) Int. Cl.
*G01R 33/48* (2006.01)
*G01R 33/567* (2006.01)
*G01R 33/561* (2006.01)
*G01R 33/54* (2006.01)
*G01R 33/56* (2006.01)
*G01R 33/563* (2006.01)
*G01R 33/28* (2006.01)

(52) U.S. Cl.
CPC ...... *G01R 33/4822* (2013.01); *G01R 33/5614* (2013.01); *G01R 33/56325* (2013.01)

(58) Field of Classification Search
CPC ...... G01R 33/288; G01R 33/56; G01R 33/54; G16B 45/00; A61B 5/055
See application file for complete search history.

(56) References Cited

U.S. PATENT DOCUMENTS

| | | | |
|---|---|---|---|
| 2013/0119983 A1* | 5/2013 | Zenge | G01R 33/56 324/309 |
| 2014/0121496 A1* | 5/2014 | Bi | A61B 5/7292 600/413 |
| 2016/0104279 A1* | 4/2016 | Li | G06K 9/52 382/131 |
| 2016/0216354 A1* | 7/2016 | Wang | G01R 33/543 |
| 2017/0242086 A1 | 8/2017 | Wetzl et al. | |
| 2017/0371001 A1* | 12/2017 | Dempsey | A61N 5/1049 |

OTHER PUBLICATIONS

Wetzl, et al.: "Isotropic 3-D CINE Imaging with Sub-2mm Resolution in a Single Breath-Hold"; Proc. Intl. Soc. Mag. Reson. Med.; vol. 23; (2015) abstract No. 1011.

Coppo, et al.: "Free-Running 4D Whole-Heart Self-Navigated Golden Angle MRI: Initial Results"; Magnetic Resonance in Medicine; vol. 74; pp. 1306-1316; (2015).

Han, et al.: "Four-Dimensional, Multiphase, Steady-State Imaging with Contrast Enhancement (MUSIC) in the Heart: A Feasibility Study in Children"; Magnetic Resonance in Medicine; vol. 74; pp. 1042-1049, (2015).

Wetzl, et al.: "Free-Breathing, Self-Navigated Isotropic 3-D CINE Imaging of the Whole Heart Using Cartesian Sampling"; Proc. Intl. Soc. Mag. Reson. Med.; vol. 24; (2016) abstract No. 411.

Sorensen, et al.: "Operator-Independent Isotropic Three-Dimensional Magnetic Resonance Imaging for Morphology in Congenital Heart Disease"; iCirculation; vol. 110; pp. 163-169; (2004).

Bieri, et al.: "Fundamentals of Balanced Steady State Free Precession MRI";: Journal of Magnetic Resonance Imaging; vol. 38; pp. 2-11; (2013).

Klein, et al.: "Cardiac Magnetic Resonance imaging Using an Open 0.35 T System"; J Comput Assist Tomogr; vol. 31, No. 3; pp. 430-434; (2007).

\* cited by examiner

METHOD AND MAGNETIC RESONANCE APPARATUS FOR ACQUIRING DIAGNOSTIC MEASUREMENT DATA OF A HEART

BACKGROUND OF THE INVENTION

Field of the Invention

The invention concerns a method, a medical imaging apparatus, and an electronically-readable data storage medium for acquiring diagnostic measurement data of a heart by a magnetic resonance, and to a method for a heart examination.

Description of the Prior Art

In a magnetic resonance apparatus, also known as a magnetic resonance tomography system, the body of an examination object to be examined, such as a patient, a healthy test object, an animal or a phantom, is subjected by the operation of a basic field magnet to a relatively high basic magnetic field, of 1.0 or 1.5 or 3 tesla for example. In addition gradient fields are applied with the use of a gradient coil arrangement. Then, via a radio-frequency antenna, radio-frequency pulses (RF pulses), for example excitation pulses, are emitted by suitable antenna coils, which leads to the nuclear spins of specific atoms, which are resonantly excited by these RF pulses being given a magnetization that causes those nuclear spins to be flipped by a defined flip angle that deviates from the filed lines of the basic magnetic field. During the relaxation of the nuclear spins, RF signals, called magnetic resonance signals (MR signals) are emitted, which are received by suitable RF antennas, and then further processed. The desired image data can be reconstructed from the raw data acquired in this way.

SUMMARY OF THE INVENTION

Magnetic resonance imaging can be used especially advantageously for recording diagnostic measurement data of the heart of the examination object. An object of the invention is to provide a simple method for recording diagnostic measurement data of a heart by operation of a magnetic resonance apparatus, as well as a simple method for a heart examination, which creates image data of a heart with a good clinical contrast.

In the inventive method for recording of diagnostic measurement data of a heart of an examination object by operation of a magnetic resonance apparatus, the scanner thereof is activated in accordance with a MR control sequence that includes radiating an RF pulse for excitation of nuclear spins with a flip angle of at least 60°, acquiring the diagnostic measurement data in a coordinate system that is independent of the heart, and generating the basic magnetic field in the magnetic resonance data acquisition scanner so as to be smaller than 1.0 tesla.

The basic magnetic field is typically constant and homogeneous, within a data acquisition region of the magnetic resonance scanner. A high homogeneity of the basic magnetic field is necessary for imaging. The examination region is all or a part of the examination object that is to be presented as an image. As noted, the basic magnetic field created by the magnetic resonance device scanner in accordance with the invention is smaller than 1.0 tesla. The basic magnetic field created by the magnetic resonance scanner is preferably smaller than 0.8 tesla, especially preferably smaller than 0.6 tesla. Magnetic resonance apparatuses designed in this way are especially cost-effective and easy to manufacture. With such a low basic magnetic field of this type, the desired homogeneity of the basic magnetic field, especially within the examination region such as a region with a spatial extent of at least 35 cm in the isocenter of the data acquisition region, can be achieved especially well and/or cost-effectively.

An MR control sequence is designed to manipulate nuclear spins in an examination object such that the spins create an MR signal that will be recorded. To this end, an MR control sequence is composed of a sequence of RF pulses, such as excitation pulses and refocusing pulses, as well as gradient pulses that are emitted suitably coordinated therewith. The gradient pulses create dynamic magnetic field gradients, which are used for spatially encoding the MR signals. Read-out windows matched to these in time must be set, which specify the periods of time in which the induced signals are acquired. Of decisive importance for the imaging in such cases is the timing within the sequence, i.e. the specific time intervals in which particular pulses follow one another.

The acquisition of the induced signals (the MR signals), can be referred to in such cases as the recording of diagnostic measurement data. The recording of diagnostic measurement data can include a storage of the acquired diagnostic measurement data and/or preparation for reconstruction of the diagnostic measurement data into image data. The diagnostic measurement data are typically called raw data, so that a further processing, especially a reconstruction of the diagnostic measurement data (image data), is required for a pictorial representation.

The diagnostic measurement data are recorded within the examination region that, in accordance with the invention, includes the heart of the examination object. The examination region is typically square in shape. The position and/or orientation of the examination region is selected in this case such that the heart of the examination object is included in the examination region. After acquisition and/or after the recording of the diagnostic measurement data, the data are typically reconstructed into image data, which visualize at least a part of the examination region. The examination region is typically spanned by a coordinate system, with this coordinate system defining the position and especially the orientation of the examination region. A coordinate system independent of the heart means that the orientation of the coordinate system is independent of the location and/or orientation of the heart of the examination object. A coordinate system independent of the heart means that the orientation of the coordinate system is independent of an examination object. Accordingly, for the determination of the examination region, in particular for the determination of the coordinate system spanning the examination region, the only knowledge about the location of the heart of the examination object that is required is that the heart of the examination object is included in the examination region. The coordinate system independent of the heart can be determined by the magnetic resonance scanner. For example, the coordinate system independent of the heart can correspond to the main axes of the magnetic resonance scanner, or can be offset relative to those axes by translation. The main axes of the magnetic resonance device are typically defined by the longitudinal axis of the cylindrical patient recording volume, an axis running vertical thereto, and an axis running at right angles horizontally thereto. If necessary a position of the heart can be taken into account for this coordinate system independent of the heart.

The RF pulses are typically radiated into the examination region of the examination object resonantly at the Larmor frequency of the nuclear spins. Depending on the amplitude of the RF pulse and/or the duration of the RF pulse, the nuclear spins are flipped by a defined flip angle. Nuclear spins are initially aligned by the basic magnetic field, so that the nuclear spins proceed on average parallel to the magnetic field lines of the basic magnetic field. This state is typically referred to as the steady state and/or steady position of the nuclear spins. RF pulses that are used as excitation pulses are characterized in that they flip the nuclear spins from their steady position by the defined flip angle, i.e. flip the nuclear spins in relation to the magnetic field lines of the basic magnetic field. The flip angle designates the angle between the magnetization vector, which describes the position of the nuclear spins immediately after the excitation, and the magnetic field lines of the basic magnetic field. RF pulses that are used as refocusing pulses typically act at right angles to the magnetic field lines of the basic magnetic fields and manipulate previously excited nuclear spins. The RF pulse for excitation of nuclear spins has a flip angle of at least 60°, preferably of at least 90°, especially preferably of at least 120°. Typically a higher flip angle for the RF pulse for excitation of nuclear spins is possible with lower strength of the basic magnetic field, so that for example, with a basic magnetic field with 0.6 tesla, a three-dimensional MR control sequence can have an RF pulse for excitation of nuclear spins with a flip angle of 140°. With a two-dimensional MR control sequence, the RF pulse for excitation of nuclear spins can have a flip angle of between 150° and 180°.

An advantage of the inventive method is that the recording of diagnostic measurement data of the heart can be carried out especially simply by operation of the magnetic resonance scanner.

If the basic magnetic field has a strength of maximum 1.0 tesla, then an MR control sequence can be used that has an RF pulse for excitation with a flip angle of at least 60°. The specific absorption rate (SAR), which quantifies a power delivery to the examination object during the examination, is proportional to the square of the strength of the basic magnetic field. If an examination is carried out with a magnetic resonance scanner having a basic magnetic field with a strength of 1.0 tesla, then the SAR value for an RF pulse amounts only to a ninth of the SAR value of the RF pulse for operation with a basic magnetic field with a strength of 3.0 tesla. The maximum permitted SAR is limited by regulations to 2 W/kg, so the number of RF pulses per unit of time and/or the flip angle created by an RF pulse is thereby constrained. The greater the flip angle created by an RF pulse, the higher is the SAR created by the RF pulse.

If a magnetic resonance examination is carried out by a magnetic resonance scanner having a basic magnetic field with a strength of smaller than 1.0 tesla, then the SAR value associated with an RF pulse is smaller than for a magnetic resonance scanner with a basic magnetic field with a strength of above 1.0 tesla. The difference in the SAR value resulting therefrom can be used so as to achieve a higher temporal density of the RF pulses and/or for RF pulses that create a higher flip angle.

For heart examinations in particular, a strong contrast and/or a strong contrast-to-noise ratio between myocardium and blood is required for a reliable clinical diagnosis. The contrast between myocardium and blood, depending on the MR control sequence used, can be increased by increasing the flip angle created by the RF pulse for excitation. With a flip angle of at least 60° in particular, further measures for increasing the contrast between myocardium and blood can be dispensed with. Thus, for example, the diagnostic measurement data can be recorded independently of a direction of flow and/or speed of flow of the blood. This makes possible the recording of the diagnostic measurement data in a coordinate system independent of the heart. The examination region can also be freely selected and/or selected without taking into account vessels running to the heart. For example, the examination region can be selected such that vessels running to the heart are excluded from the examination region and diagnostic measurement data of the heart can be recorded at high resolution and/or with high temporal efficiency. This is possible since, independently of the direction of flow and/or speed of flow of the blood, a high contrast between blood and myocardium can be generated. As an alternative, however, vessels running to the heart can still be included in the examination region.

The low strength of the basic magnetic field of maximum 1.0 tesla reduces the limitation of the RF pulses with respect to SAR, such that the reduction can be used synergistically for a larger flip angle of the RF pulses of at least 60°. If RF pulses with such large flip angles are used for excitation, then this enables such a high contrast between myocardium and blood to be created, so that further contrast-increasing effects, such as a blood flow, can be dispensed with, and the diagnostic measurement data can be recorded in a coordinate system independent of the heart. Subsequently, on the basis of the diagnostic measurement data, a coordinate system dependent on the heart can be defined.

The recording of the diagnostic measurement data does not require any complex preparation and can be carried out intuitively. The diagnostic measurement data can be recorded independently of the direction of the blood flow and thereby independently of an axis of the heart. Consequently, a recording of more detailed overview measurement data, which shows the heart of the examination object in detail, can be dispensed with. This reduces the length of the examination. In addition, the recording of the diagnostic measurement data of the heart can be supervised and/or controlled by one person, with that person not having to have detailed knowledge about the structure of the heart. Consequently such an examination can be carried out by persons having less training.

Typically, overview measurement data are recorded before the recording of the diagnostic measurement data, and such overview data are preferably reconstructed into overview image data. On the basis of the overview measurement data and/or the overview image data, the recording of the diagnostic measurement data is typically prepared during a user interaction. In such a user interaction, there is an entry of a command by a user via a suitable input unit. In the user interaction, recording parameters can be entered for the recording of the diagnostic measurement data during this process. The user interaction can also include a validation, which involves a check, of automatically established recording parameters. Recording parameters can naturally also be changed in the user action.

Preferably only one user interaction is required between the recording of the overview measurement data and the recording of the diagnostic measurement data. By taking into account the overview measurement data, in particular by taking the heart into account in the overview measurement data, a position and/or spatial extent of the examination region for the recording of the diagnostic measurement data is determined. No account is taken here of the orientation of the heart and/or anatomical axes of the heart. In particular, there is typically no change and/or adaptation of the orientation of the examination region to the heart. The orientation of the coordinate system spanning the examination region typically corresponds to the orientation of the main axes of the magnetic resonance scanner. In the user interaction, it need only be ensured that the heart is included in the examination region.

In addition and/or as an alternative, the comfort for the examination object is enhanced, since in accordance with the inventive method the diagnostic measurement data can be recorded especially quietly and with an especially low SAR load for the examination object, i.e. with especially little heat being generated. Moreover the basic magnetic field typically has a higher homogeneity at lower strengths, so elaborate shimming of the basic magnetic field can be dispensed with for the examination object, which enables the duration of the examination to be shortened. Likewise, the RF field created within the examination region by an RF pulse is typically more homogeneous at lower strengths of the basic magnetic field, so that image data to be reconstructed exhibit a more even contrast and/or are of higher quality.

The inventive method for recording diagnostic measurement data can be expanded by a further method step to a method for recording and evaluation of diagnostic measurement data. In the further method step, the diagnostic measurement data are post-processed for an evaluation. Image data can be reconstructed in the further method step, and on the basis of the image data an anatomical structure can be identified by threshold value analysis. Post-processing of this type is preferably carried out by algorithms. The image data, on account of the low strength of the basic magnetic field, exhibit an especially even contrast and/or an especially high quality, so a large number of different algorithms are available for post-processing. For example, there can be recourse to general image processing algorithms, in order to localize and/or to segment anatomical structures, classify illnesses and/or quantify volumes. Such general image processing algorithms are typically based on the assumption that the same tissue creates an equal signal intensity in image data. Due to the low strength of the basic magnetic field and the resulting even contrast and/or high quality of the image data in accordance with the invention, this assumption is fulfilled. The inventive method accordingly makes it possible to use especially simple and robust algorithms for post-processing, which enables the post-processing to be carried out in an especially robust manner.

In an embodiment of the method, the MR control sequence is a three-dimensional MR control sequence. A distinction is typically made between two-dimensional and three-dimensional MR control sequences. A two-dimensional MR control sequence is characterized by the examination region being divided into measurement slices in parallel with one another, so a measurement slice has a slice thickness. There can be a spacing between two neighboring measurement slices. A two-dimensional MR control sequence typically records diagnostic measurement data for each individual measurement slice, which can then be reconstructed such that an individual measurement slice can be represented as a cross-sectional image of the examination region. The slice thickness typically corresponds to the extent of a voxel at right angles to the measurement slice.

By contrast, a three-dimensional MR control sequence records the examination region as a volume. In this case the examination region is divided into cube-shaped sections, called voxels, with such voxels typically being equal in size and arranged in a matrix. During reconstruction of three-dimensional diagnostic measurement data recorded in this way, three-dimensional image data will be created, which reproduce the examination region. Based on three-dimensional image data different, sectional images can be created and presented for viewing. Typically the position and/or orientation of these types of sectional images is freely selectable. Based on three-dimensional diagnostic measurement data, sectional images can be created in different orientations. In particular, in a heart-dependent coordinate system, relevant axes can be included for cardiological examinations, for example horizontal and/or vertical long axes and/or short axes for creation of sectional images. The planning and/or selection of these types of sectional images is especially simple and intuitive, since the selection can be made of the basis of diagnostic measurement data reconstructed to high-resolution and/or good-quality image data.

An advantage of this form of embodiment of the inventive method lies in the fact that the diagnostic measurement data can be recorded especially well in a coordinate system independent of the heart. The contrast between blood and myocardium, even independent of the flow of the blood, is guaranteed by the high flip angle of the RF pulse, which is used for excitation. The examination region thus can be chosen regardless of the direction and/or orientation of the blood flow. Moreover, it is not necessary to take into account an axis of the heart during the recording of the three-dimensional diagnostic measurement data, since three-dimensional image data and sectional images in any given position and/or orientation can be created for the diagnosis. The diagnostic measurement data can be recorded independently of the direction of the blood flow and thus independently of an axis of the heart.

In this embodiment, complex planning in advance of the recording of the diagnostic measurement data is not needed. Likewise, planning of the measurement slices, in particular their orientation, before beginning of recording of the diagnostic measurement data is not needed. This is especially advantageous since this type of planning is typically carried out based on image data that are of poor quality and/or are influenced by breathing and/or movement of the examination object, and are therefore susceptible to errors.

Three-dimensional diagnostic measurement data, IN comparison with two-dimensional diagnostic measurement data, typically exhibit an improved signal-to-noise ratio and spaces between neighboring measurement slices can be avoided especially effectively. This also enables projections of the heart to be created. Three-dimensional MR control sequences typically have a higher efficiency during recording of the diagnostic measurement data, so that it is possible to cover a larger examination region. The examination region can be chosen large enough for, in addition to the heart, the vessels running to the heart also to be included in the examination region. For this purpose, the examination region is typically oriented sagittally, which is characterized by the direction of the frequency encoding being along the head-to-foot direction of the examination object, in particular a patient. This enables the examination region to be recorded especially quickly, since the quickest method can be used in the direction of the largest spatial extent for recording of diagnostic measurement data.

Typically the recording of three-dimensional diagnostic measurement data using RF pulses with large flip angles is limited because of SAR, since three-dimensional recording is typically associated with a high time density of RF pulses. This limitation is efficiently eliminated when carrying out this form of embodiment of the inventive method, as a result of the use of a magnetic resonance scanner with a basic magnetic field of smaller than 1.0 tesla. Thus three-dimensional diagnostic measurement data of the heart can be recorded, for example, in less than 4 minutes, preferably in less than 3 minutes.

In another embodiment of the method, the MR control sequence is designed, such that, at the time of the data recording, the excited nuclear spins are in a steady state.

Nuclear spins exhibit a steady state, i.e. a stationary state, when the natural relaxation of the nuclear spins is counteracted by RF pulses such that, with temporal and/or spatial averaging, a constant magnetization arises. In the steady state the magnetization is accordingly in a settled state and exhibits a periodic or constant behavior. The occurrence and/or the type of the steady state is defined in such cases by the time sequence of the RF pulses, by their flip angles and by the relaxation characteristics of the nuclear spins.

An advantage of this embodiment is that the diagnostic measurement data are recorded continuously and under the same conditions. Diagnostic measurement data recorded in this way are especially homogeneous. In addition, with an MR control sequence designed in this way, an especially good contrast between myocardium and blood can be created, so that a clinical diagnosis based on such diagnostic measurement data can be made especially reliably.

The creation of a steady state typically requires a number of RF pulses with flip angles of greater than 60°, so that a combination of this embodiment with a basic magnetic field of smaller than 1.0 tesla makes possible a high temporal density of RF pulses, without the SAR limit of 2 W/kg being exceeded. If the diagnostic measurement data are recorded statically, i.e. not time-resolved, then the diagnostic measurement data can be recorded in this embodiment with a high resolution and/or with a high quality, such that a diagnosis of coronary arteries is possible. Since in this case the diagnostic measurement data are typically dependent on the heartbeat, the data are preferably recorded taking into account the heartbeat, for example by suitable triggering. In this way, three-dimensional diagnostic measurement data can be recorded with especially high quality and/or resolution within a short period of time of less than 10 minutes, preferably of less than 8 minutes, with the diagnostic measurement data at the same time exhibiting a good contrast between blood and myocardium. This is made possible by the combination of the aforementioned features.

An MR control sequence, which puts the excited nuclear spins into a steady state at the time of recording, can also be time-resolved. Time-resolved MR control sequences, by comparison with static MR control sequences, typically have a lower spatial resolution, which is why they will be used, for example, for diagnosis of a heart function involving a deformation, instead of for diagnosis of coronary arteries. A recording of the diagnostic measurement data of this type can typically be made in less than 5 minutes.

In another embodiment of the method, the MR control sequence is designed such that, at the time of recording, stimulated echoes occur. Stimulated echoes are typically created by an RF pulse when nuclear spins at the time of the RF pulse still exhibit cross-magnetization, i.e., the magnetization is thus not yet fully relaxed. Stimulated echoes increase the recorded MR signal and the stimulated echoes can be used to intensify a specific contrast, for example between blood and myocardium. Here, for example, an especially long relaxation time of a tissue type can be used to create stimulated echoes. This enables the contrast to be improved.

In another embodiment of the method, the MR control sequence is based on an SSFP MR control sequence. "Steady state free precession" (SSFP) MR control sequences are designed such that, at the time of recording of the diagnostic measurement data, the excited nuclear spins have a steady state and stimulated echoes occur. SSFP-based MR control sequences, such as balanced SSFP (e.g. Bieri et al., "Fundamentals of balanced steady state free precession MRI", doi:10.1002/jmri.24163, JMRI) or "true fast imaging with steady-state free precession" (TRUFI), exhibit an especially good signal-to-noise ratio and create an especially strong T1/T2 image contrast. They are particularly well-suited for recording diagnostic measurement data of a heart to allow distinguishing between myocardium and blood.

In another embodiment of the method, the MR control sequence is a three-dimensional CINE MR control sequence. A CINE MR control sequence is an SSFP-based three-dimensional MR control sequence with an additional time resolution. The image data reconstructed from the diagnostic measurement recorded with a CINE MR control sequence accordingly exhibits a good contrast between myocardium and blood and can be used to create sectional images in any given position and/or orientation within the examination region. The additional time resolution makes possible an especially precise evaluation of a function of the heart of the examination object, and thus an especially precise diagnosis.

A CINE MR control sequence for creating a good contrast between blood and myocardium with time resolution typically requires a number of RF pulses with flip angles of greater than 60°, so that a combination of this embodiment with a basic magnetic field of smaller than 1.0 tesla makes possible a high temporal density of RF pulses, without the SAR limit of 2 W/kg being exceeded. Thus the diagnostic measurement data, in particular time-resolved diagnostic measurement data, can be fully recorded within a short period of time of less than 6 minutes, preferably of less than 5 minutes, especially preferably of less than 4 minutes. Based on such diagnostic measurement data, image data can preferably be reconstructed, with the image data representing at least one heart cycle with a good contrast between blood and myocardium, so that the deformation of the myocardium during a heartbeat is able to be visualized. This is made possible by the combination of the aforementioned features.

In another embodiment of the method, the recorded diagnostic measurement data to be isotropic. Particularly with two-dimensional diagnostic measurement data the slice thickness is greater than the spatial extent of a voxel within a measurement slice. In addition, with two-dimensional diagnostic measurement data, spaces can occur between individual measurement slices. If the recorded diagnostic measurement data are isotropic, then the spatial extent of a voxel in the correspondingly reconstructed image data is the same size in three spatial directions orthogonal to one another. This type of image data appear especially homogenous to the human eye. Based on this type of image data, sectional images of approximately the same quality can be created in three spatial directions and/or combinations thereof. In this way, a further recording of MR signals of the heart, in particular a further recording of diagnostic measurement data of the heart of the examination object in a further spatial orientation, can be dispensed with. Typically, isotropic diagnostic measurement data are three-dimensional.

In an embodiment of the method, the diagnostic measurement data are entered into k-space along a Cartesian trajectory. The data space, in which diagnostic measurement data are entered, is referred to as k-space and/or raw data space. The data in k-space are transformed by Fourier transformation into image data in the image space. In the image domain, the image data can be specified and there can also be a pictorial representation of the examination region. In this process, the acquired raw data are entered to individual points in the k-space, which typically fulfill specific criteria and typically describe a pattern. In Cartesian recording, diagnostic measurement data is recorded along straight lines running in parallel within a limited area of k-space.

By comparison with radially recorded diagnostic measurement data for example, the examination region can be freely selected for Cartesian recording, so that a choice of a cube-shaped examination region can be dispensed with. A radial recording of diagnostic measurement data typically requires a cube-shaped examination region. This enables the examination region to be better adapted to the shape of the heart and/or to the heart of the examination object. This typically enables a smaller examination region to be selected, for which smaller examination region fewer diagnostic measurement data are required, so the period of time necessary for the recording of the diagnostic measurement data can be shortened. In addition, a reconstruction of diagnostic measurement data recorded using a Cartesian system to image data can be carried out especially easily, even if the diagnostic measurement data recorded using a Cartesian system are undersampled, since in particular no regridding is necessary. An additional acceleration of the reconstruction of the image data can be achieved by an iterative reconstruction being carried out only in undersampled spatial directions, while completely sampled spatial directions are reconstructed by Fourier transformation. This enables the period of time needed for the reconstruction of the image data to be reduced, so as to amount to less than 2 minutes, for example. This enables the image data to be presented to an examining doctor for example while the examination object is still positioned within the magnetic resonance device.

In another embodiment of the method, the diagnostic measurement data are recorded undersampled. Undersampled diagnostic measurement data do not fulfill the Nyquist criterion. Reconstruction algorithms, such as Compressed Sensing for example, make it possible, despite the undersampling, to reconstruct the image data based on the undersampled diagnostic measurement data. Because of the undersampling, less diagnostic measurement data are recorded than for a complete recording of the diagnostic measurement data that fulfills the Nyquist criterion. Undersampling enables the diagnostic measurement data to be recorded especially quickly so that the period of time that is needed for emitting the MR control sequence can be shortened. This makes it more comfortable for the examination object and may make it possible for at least some of the diagnostic measurement data to be acquired while the subject is holding his or her breath.

In another embodiment of the method, the diagnostic measurement data are recorded time-resolved. The time resolution makes possible an especially precise evaluation of a function of the heart of the examination object and thus an especially precise diagnosis.

In another embodiment of the method, the diagnostic measurement data are recorded while the examination object is breathing freely. In this embodiment it is not necessary for the examination object to hold his or her breath during the recording of the diagnostic measurement data. The MR control sequence is preferably designed so that movement within the examination region created by breathing can be compensated for. This increases the comfort for the examination object.

In another embodiment of the method, breath-triggered recording of the diagnostic measurement data takes place. Breath triggering synchronizes the recording of the diagnostic measurement data with the breathing of the examination object. Preferably a breath-triggered recording takes place while the examination object is breathing freely. The breath triggering makes it possible for recording of the diagnostic measurement data individually to be tailored to the breathing of the examination object, so that, for example, the recording of the diagnostic measurement data always occurs over a number of breath cycles and at a specific point in time within each breathing cycle. The breath triggering can involve gating. Gating means that, when the examination object is breathing freely, measurement data are recorded continuously and a part of the measurement data is selected as a function of the point in time of the recording as diagnostic measurement data. Even when the examination object is breathing freely, breath triggering enables the quality of the diagnostic measurement data to be improved. Movement because of breathing can be checked and irregular breathing can also be compensated for.

In another embodiment of the method, the breath triggering is self-navigated. When the breath triggering is self-navigated, then with a time-resolved measurement on the basis of recorded diagnostic measurement data, a point in time within a breath cycle can be defined for the recording of the diagnostic measurement data. The point in time is typically determined in this case during recording of the diagnostic measurement data on the basis of the diagnostic measurement data already recorded at an earlier time during the recording of the diagnostic measurement data. Self-navigated breath triggering typically uses gating. In this embodiment of the method, the diagnostic measurement data is recorded especially robustly and easily. This makes this embodiment of the method less susceptible to errors, and it can be carried out with little effort.

In another embodiment of the method, the method is conducted without contrast medium. Since the MR control sequence has an RF pulse for excitation of nuclear spins with a flip angle of at least 60°, an especially good contrast between blood and myocardium can be achieved, even in the absence of a contrast medium. In accordance with the inventive method, particularly when a time-resolved SSFP or CINE MR control sequence is used, even the flow of the blood in the heart of the examination object can be shown without the administration of a contrast medium, which typically highlights blood in comparison with the environment. If a contrast medium can be dispensed with, the recording of the diagnostic measurement data is less risky and thus can be conducted for a larger group of patients. In addition, the duration of the examination is shortened, since the time for the administration of a contrast medium, and waiting for the contrast medium bolus to arrive at the region of interest, can be dispensed with.

The invention also encompasses a method for a heart examination wherein an overview recording of the object is obtained, diagnostic measurement data are recorded in accordance with the inventive method described above, taking into account the overview recording, the diagnostic measurement data to image data are reconstructed into a heart-dependent coordinate system is determined on the basis of the image data, and the image data are presented in the heart-dependent coordinate system.

Overview measurement data are acquired during an overview recording. The overview measurement data are primarily, possibly exclusively, intended for use in setting recording parameters and/or an examination region for a subsequent recording of diagnostic measurement data. Image data, which will be stored in a database, can also continue to be reconstructed from the overview measurement data. The image data reconstructed from the overview measurement data, however, are not of central interest for a diagnosis. The overview measurement data can also be stored together with the image data. Usually, overview measurement data are displayed to a doctor during diagnosis only insofar as it shows the doctor the point at which the actual diagnostic image data have been recorded. Thus, in the overview measurement data for example, the position or the positions can be indicated that identify the position of the actual diagnostic image data in the body. It is also conceivable in some cases for the overview measurement data not to be stored in a database and to be discarded once used for setting the recording parameters.

Diagnostic image data can be generated from diagnostic measurement data, which by contrast with the overview measurement data can be displayed to a doctor making the diagnosis on a display unit. The diagnostic measurement data thus represents data that will be reconstructed into image data, which are displayed to a doctor during a later diagnostic appraisal, in order to make the actual diagnosis on the basis of the image data. In addition or as an alternative, physiological parameters of the heart of the examination object can be computed from the diagnostic measurement data, which can be provided to the doctor making the diagnosis.

The inventive heart examination delivers diagnostic measurement data that can serve as a foundation for an assessment of a heart function of the examination object. Typically a number of views of the heart are required for a complete heart examination. The number of views can be generated on the basis of two-dimensional recordings of diagnostic measurement data, which were each recorded separately according to these views. The number of views can be generated on the basis of a three-dimensional recording of diagnostic measurement data.

If the number of views are generated on the basis of two-dimensional recordings of diagnostic measurement data, then a correct orientation of the examination region to be recorded in each case and/or positioning of the measurement slices is already typically required before the recording of the diagnostic measurement data of each view. For the determination of a correct orientation, at least one overview recording and at least one user interaction are typically required. Preferably, at least one overview recording and at least one user interaction are required for each of the number of views.

The recording of the diagnostic measurement data, taking into account the overview recording, means that, by a user interaction on the basis of overview measurement data recorded by the overview recording, at least one recording parameter, such as the examination region, is defined or set, which recording parameter will be taken into account during the emission of the MR control sequence for recording of the diagnostic measurement data.

The heart examination preferably includes precisely one overview recording, on the basis of which the examination region is defined, within which examination region the diagnostic measurement data are then recorded. The definition is typically implemented in a user interaction, preferably in precisely one user interaction. This can be combined with the recording of three-dimensional measurement data. In this process, the position and/or the spatial extent of the examination region is defined on the basis of the overview measurement data recorded by the overview recording. In this process the examination region is preferably selected so that this region includes the heart. An orientation of the heart and/or of the examination region is in this case preferably not explicitly determined and/or changed.

The diagnostic measurement data of the heart are recorded in accordance with the invention by generating a magnetic resonance scanner, which is activated in accordance with an MR control sequence, wherein the MR control sequence has an RF pulse for excitation of nuclear spins with a flip angle of at least 60°, the diagnostic measurement data are recorded in a coordinate system independent of the heart, and the basic magnetic field produced in the magnetic resonance scanner is smaller than 1.0 tesla.

The diagnostic measurement data recorded in this way are reconstructed into image data, wherein this is typically done by means of an algorithm in the control computer. If the image data are displayed, then the image data visualize the examination region in accordance with the voxels, which voxels are defined by recording parameters of the MR control sequence. The image data can cover the examination region in the form of measurement slices in parallel to one another and/or by a three-dimensional matrix. Preferably the diagnostic measurement data and the image data are three-dimensional. The image data are preferably displayed to a doctor making the diagnosis on a display unit. The doctor making the diagnosis, taking into account the image data, can select, via an input unit for example, a desired view and/or a desired sectional image, with this view and/or sectional image depending on the structure and/or the orientation of the heart of the examination object. In this way, the doctor making the diagnosis can define a heart-dependent coordinate system on the basis of the choice of a sectional image and/or a view. The view and/or the sectional image can be visualized to the doctor making the diagnosis on a display unit, in this subsequently defined heart-dependent coordinate system.

An advantage of such a heart examination is that a complete heart examination can be carried out especially simply on the basis of a magnetic resonance imaging with a basic magnetic field smaller than 1.0 tesla, since the clinical contrast can be improved as a result of the choice of the RF pulse for excitation of nuclear spins with a flip angle of at least 60°. In addition, after conclusion of the recording of the diagnostic measurement data, a heart-dependent coordinate system can be defined, which is able to be implemented especially easily, since the diagnostic measurement data includes the region of interest for the examination and is available as high-quality data, so that a heart-dependent slice orientation can be established especially easily. If the diagnostic measurement data are three-dimensional, then the corresponding image data can also be presented in a number of heart-dependent coordinate systems different from one another. This enables different views tailored individually to the heart of the examination object to be created, without a further recording of diagnostic measurement data being necessary. This reduces the duration of the heart examination.

The inventive method accordingly makes possible an especially reliable and efficient diagnosis of the heart. Further advantages of the inventive method for a heart examination essentially correspond to the advantages of the inventive method for recording of diagnostic measurement data of a heart, which have been described above in detail. Features, advantages or alternate forms of embodiment mentioned likewise can be applicable to the other aspects of the invention.

Furthermore the invention encompasses a magnetic resonance apparatus with a control computer and a data acquisition scanner designed to carry out the inventive method for recording of diagnostic measurement data of a heart and/or the inventive method for a heart examination, wherein the basic magnetic field created by the magnetic resonance scanner is smaller than 1.0 tesla.

The computer has a processor and an input interface and an output interface for the processor. An MR control sequence can be provided to processor via the input interface. Further functions, algorithms or parameters needed in the method, for example for the reconstruction of the image data, can be provided in the computer as integrated components or separately connected components. The recorded diagnostic measurement data and/or reconstructed image data and/or further results of the inventive method can be provided as an output from the computer in electronic form, such as a data file. The computer can be integrated into the magnetic resonance apparatus. The computer and/or components thereof can also be installed separately from the magnetic resonance apparatus. The computer can be connected to the magnetic resonance apparatus.

Embodiments of the inventive magnetic resonance apparatus are analogous to the embodiments of the inventive method as described above. The magnetic resonance apparatus can have further components that are needed and/or advantageous for carrying out the inventive method. The magnetic resonance apparatus can also be designed to send control or data signals and/or to receive control or data signals and/or to process such signals, in order to carry out the inventive method. Preferably the control computer is part of the inventive magnetic resonance apparatus. Computer programs and further software can be stored in a memory of the computer, by which the processor of the computer controls and/or executes the inventive method sequence automatically.

The present invention also encompasses a non-transitory, computer-readable data storage medium encoded with programming instructions that, when the storage medium is loaded into a computer or computer system of a magnetic resonance apparatus, cause the computer or computer system to operate the magnetic resonance apparatus in order to implement any or all of the embodiments of the method according to the invention, as described above.

Examples of electronically-readable data media are a DVD, a magnetic tape or a USB stick, on which electronically-readable control information, in particular software, is stored.

The advantages of the inventive magnetic resonance apparatus and the inventive electronically-readable data storage medium essentially correspond to the advantages of the inventive method for recording diagnostic measurement data of a heart and the inventive method for a heart examination, as described above.

DESCRIPTION OF THE PREFERRED EMBODIMENTS

Figure 1:
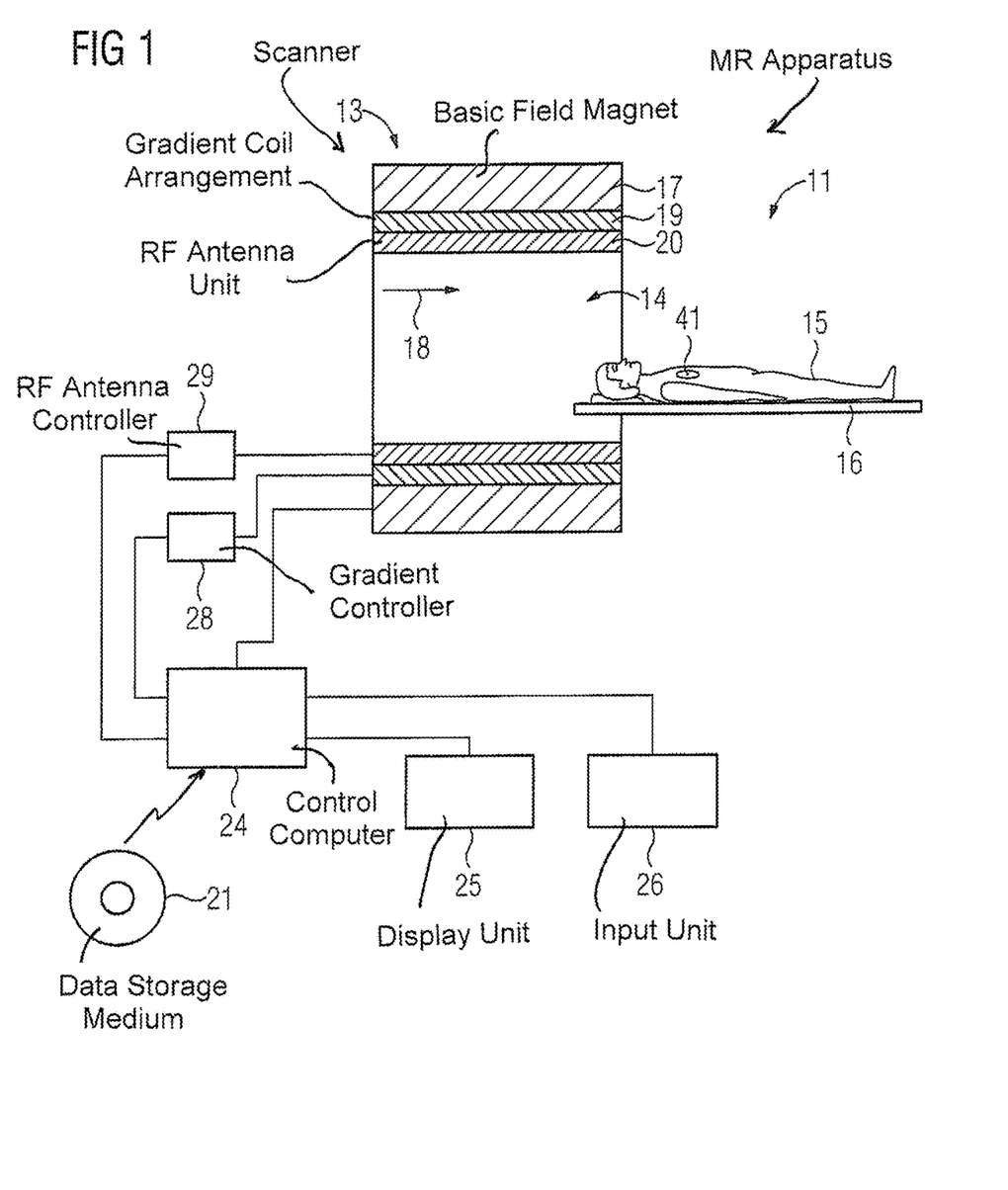
FIG. 1 schematically illustrates an inventive magnetic resonance apparatus.

FIG. 1 shows a magnetic resonance apparatus 11 for carrying out the inventive method, in a schematic illustration. The magnetic resonance apparatus 11 has a scanner 13 with a basic field magnet 17 that produces a strong and constant basic magnetic field 18. The produced basic magnetic field 18 in this case has a field strength that is smaller than 1.0 tesla. The scanner 13 has a cylindrical patient receptacle 14 in which a patient 15 is received. The patient receptacle 14 is circumferentially surrounded by the scanner 13. The patient 15 has a heart 41. The patient 15 can be moved by a patient support 16 into the patient receptacle 14. The patient support 16 has a patient table for this purpose, which is movable within the scanner 13.

The scanner 13 further has a gradient coil arrangement 19, which is used for spatially encoding MR signals during an imaging process. The gradient coil arrangement 19 is activated by a gradient controller 28. Furthermore the scanner 13 has a radio-frequency (RF) antenna unit 20, which, in the case shown, is a body coil permanently integrated into the scanner 13, and an RF antenna controller 29 that operates the antenna unit 20 so as to radiate radio-frequency pulses into an examination volume, which is essentially formed by the patient receptacle 14. The radio-frequency pulses cause the nuclear spins of certain nuclei in the patient 15, which have been resonantly excited by the radio-frequency pulses, to be given a magnetization that causes those nuclear spins to deviate from the basic magnetic field 18 by an amount known as a flip angle. As those excited nuclear spins relax and return to the steady state, they emit MR signals, which are received by the RF antenna unit 20, or by another RF antenna. The received raw MR signals are entered into an electronic memory organized as k-space in a known manner, from which image data are then reconstructed in a known manner.

For controlling the basic field magnet 17, the gradient controller 28 and the RF antenna controller 29, the magnetic resonance apparatus 11 has a control computer 24. The control computer 24 controls the magnetic resonance apparatus 11 centrally, such as to implement MR control sequences. The control computer 24 includes a reconstruction processor (not shown) for reconstruction of medical image data from diagnostic measurement data that have been acquired during the magnetic resonance examination. The magnetic resonance apparatus 11 has a display unit 25. Control information, such as control parameters, as well as reconstructed image data, can be displayed on the display unit 25, for example on at least one monitor, for a user. The magnetic resonance apparatus 11 has an input unit 26, via which information and/or control parameters can be entered during a measurement process by a user. The control computer 24 can include the gradient controller 28 and/or the RF antenna controller 29 and/or the display unit 25 and/or the input unit 26.

The control computer 24 or a processor circuit thereof is designed, together with the magnetic resonance apparatus 11, to implement the method for recording diagnostic measurement data of a heart 41 and/or a method for heart examination in accordance with the invention. To this end, the computer 24 has access to computer programs and/or software, which are loaded directly into a memory of the computer 24 (not shown), with program code for implementing the method for recording diagnostic measurement data of a heart 41 and/or the method for a heart examination, when the computer programs and/or software are executed in the computer 24. The computer programs and/or software (program code) can be stored on an electronically-readable data storage medium 21 embodied separately from the control computer 24, but which is insertable into the computer 24.

The magnetic resonance apparatus 11 can naturally have further components that magnetic resonance apparatuses usually have. The general manner of operation of a magnetic resonance apparatus is known to those skilled in the art, so that a more detailed description is not necessary herein.

A method for recording of diagnostic measurement data of a heart 41 and/or a method for a heart examination can also be available in the form of a computer program product, which causes the method to be implemented when executed by the computer 24.

Figure 2:
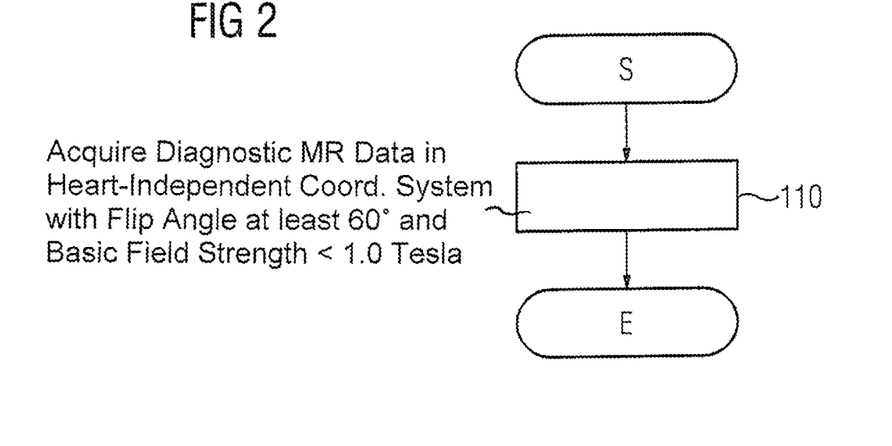
FIG. 2 is a flowchart of an embodiment of the first inventive method for recording diagnostic measurement data of a heart.

FIG. 2 shows a flowchart of an embodiment of the inventive method for recording diagnostic measurement data of the heart 41 of the patient 14 by operation of the magnetic resonance apparatus 11, which is activated in accordance with an MR control sequence. The field strength of the basic magnetic field 18 produced by the basic field magnet 17 of the scanner 13 of the magnetic resonance apparatus 11 is smaller than 1.0 tesla. At the start S of the method, the examination object, typically the patient 15, is arranged on the patient support 16, in particular on the patient table, which is positioned within the patient receptacle 14. In this case the patient support 16 and in particular the patient 15 are preferably arranged within the patient receptacle 14 such that the examination region of the patient 15 is situated in the isocenter of the patient receptacle 14.

In method step 110, diagnostic measurement data of the heart 41 of the examination object are recorded by operation of the magnetic resonance apparatus 11. In this process the scanner 13 is activated with an MR control sequence, wherein the MR control sequence has an RF pulse for excitation of nuclear spins in the examination region with a flip angle of at least 60°. The diagnostic measurement data are recorded in this case in a coordinate system that is independent of the heart 41. The recording in a coordinate system independent of the heart 41 means that the orientation and/or spatial extent of the heart 41 of the examination object is/are not used for the recording of the diagnostic measurement data, i.e. before method step 110, and thus may not even be known before method step 110. If the position and/or orientation of the heart 41 is/are known, this knowledge will not be taken into account for the recording of the diagnostic measurement data in method step 110.

The magnetic resonance sequence used in method step 110 is preferably a three-dimensional magnetic resonance sequence and/or the magnetic resonance sequence is designed such that, at the time of the recording the excited nuclear spins are in the steady state, and/or are in the steady state at the time the recording stimulated echoes occur. These features are fulfilled, for example, when the magnetic resonance sequence is based on an SSFP magnetic resonance sequence and/or the magnetic resonance sequence is a three-dimensional CINE magnetic resonance sequence. The diagnostic measurement data are preferably recorded time-resolved and/or using a Cartesian trajectory in k-space and/or undersampled. The recorded diagnostic measurement data are preferably isotropic and thus can be reconstructed into isotropic three-dimensional image data. A typical isotropic resolution is given by cube-shaped voxels with an edge length of 1.9 mm. The diagnostic measurement data are preferably recorded in method step 110 without contrast media and/or while the examination object is breathing freely and/or breath-triggered. The breath triggering can be self-navigated.

After conclusion of method step 110 the method ends at step E, wherein the diagnostic measurement data are made available from the computer 24. The diagnostic measurement data, for example, can be saved in a memory and/or reconstructed into image data.

Figure 3:
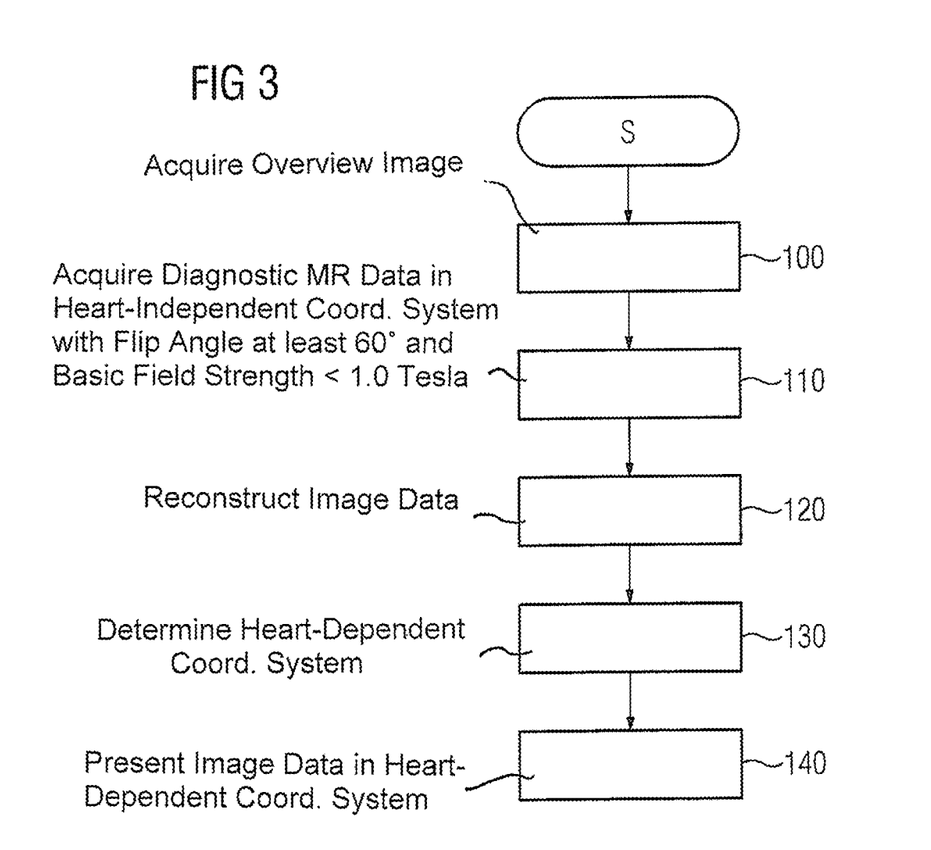
FIG. 3 is a flowchart of an embodiment of the second inventive method for heart examination.

FIG. 3 shows a flowchart of an embodiment of the inventive method for a heart examination with a recording of the diagnostic measurement data as described in FIG. 2 by operation of the magnetic resonance apparatus 11, which produces the basic magnetic field 18 with a field strength smaller than 1.0 tesla and which is activated in accordance with an MR control sequence. In a similar manner to the embodiment described in FIG. 2, the patient 15 is arranged at the start S on the patient support 16, in particular on the patient table, which is positioned within the patient receptacle 14. The patient support 16 and the patient 15 are preferably arranged within the patient receptacle 14 such that the examination region of the patient 15 is situated in the isocenter of the patient receptacle 14.

In the first method step 100, an overview recording of the heart 41 of the examination object is obtained, by overview measurement data of the heart 41 being created. In the subsequent method step 110, typically taking into account the overview measurement data of the heart 41, there is the recording of diagnostic measurement data of the heart 41 in accordance with the embodiment of the methods step 110 described in FIG. 2. The diagnostic measurement data are reconstructed into image data in method step 120, preferably by a reconstruction processor included in the control computer 24. The diagnostic measurement data and the image data are available in a coordinate system that is independent of the heart. Based on the image data a heart-dependent coordinate system is determined in the computer 24 (or in another computer to which the image data have been sent) in method step 130. The image data are presented in this heart-dependent coordinate system in method step 140. If the presentation takes place via the computer 24, the heart-dependent coordinate system can be determined interactively by a user of the magnetic resonance apparatus 11 on the basis of the display unit 25 and/or input unit 26. As an alternative, the heart-dependent coordinate system can be determined fully-automatically and/or at least in a partly automated manner. The image data are then displayed on the display unit 25 in the heart-dependent coordinate system.

Figure 4:
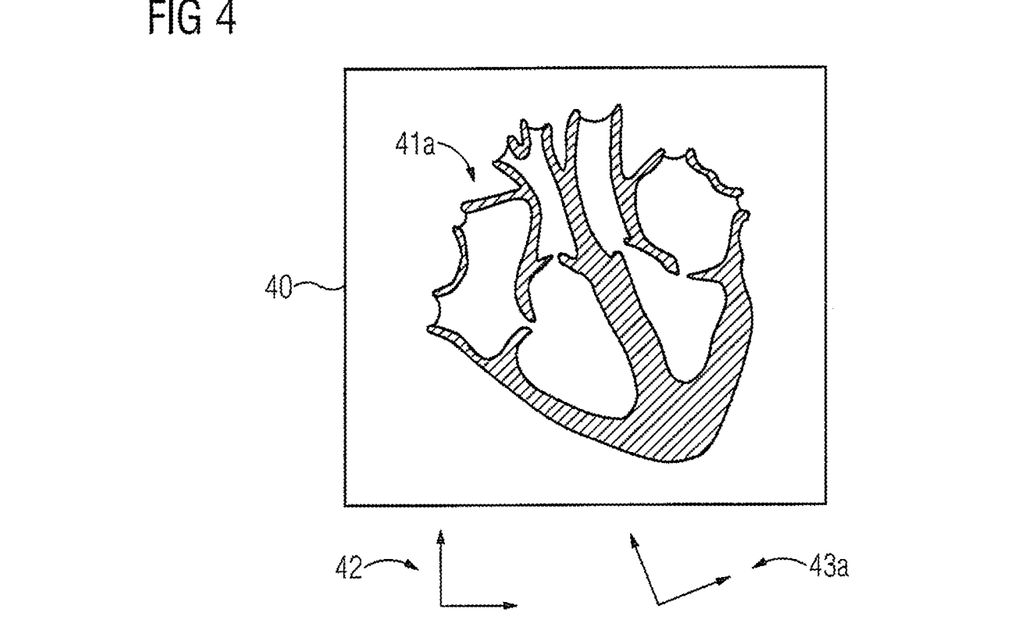
FIG. 4 shows a heart-dependent and a heart-independent coordinate system of a heart.
Figure 5:
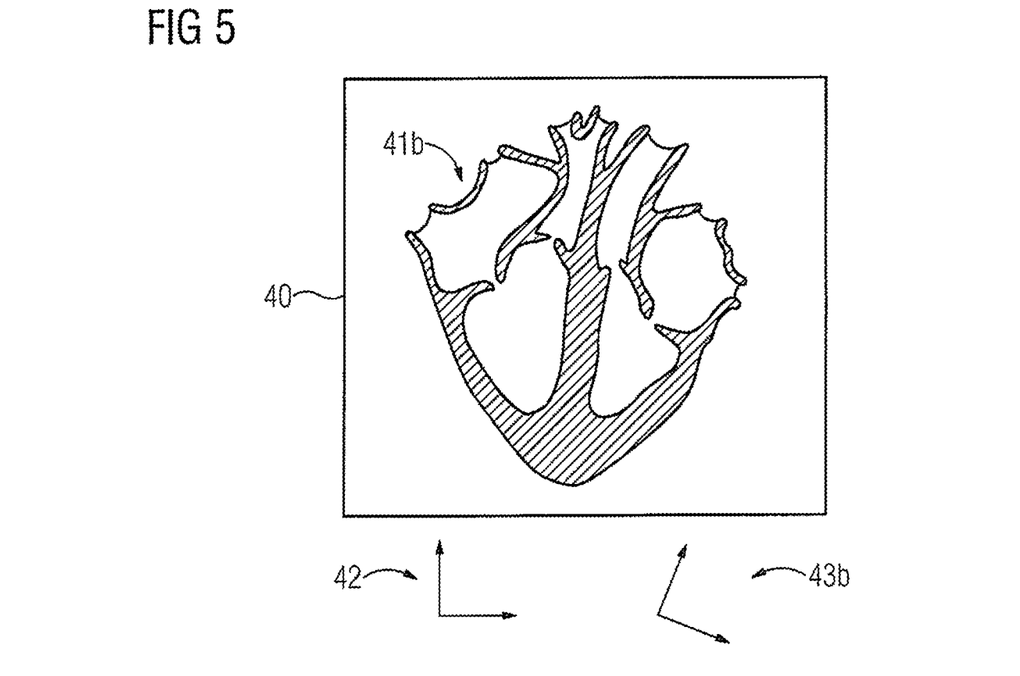
FIG. 5 shows another heart-dependent and heart-independent coordinate system of a heart.

FIG. 4 shows a heart-dependent coordinate system 43*a* and a heart-independent coordinate system 42 of a first heart 41*a*. FIG. 5 shows a heart-dependent coordinate system 43*b* and a heart-independent coordinate system 42 of a second heart 41*b*. The first heart 41*a* and the second heart 41*b* can be from different examination objects, or different views of the heart of the same examination object obtained in examinations of the heart 41 that differ from one another. In each examination the diagnostic measurement data are recorded in the heart-independent coordinate system 42 that is independent of the first examination object and/or the first heart 41*a* and/or the second heart 41*b*. The examination region 40 from which the diagnostic measurement data of the first heart 41*a* and of the second heart 41*b* were obtained is the same for both examinations. The examination region 40 in this case is heart-independent. The examination region 40 can be selected taking into account recorded overview measurement data. The selection of the examination region 40 is made without taking into account the orientation of the heart 41a, 41b. Preferably in the selection of the examination region 40, the position of the heart and/or the spatial extent of the heart 41a, 41b in at least one direction is taken into account. If necessary, the position of the heart 41a, 41b is taken into account in the selection of the examination region 40. Based on diagnostic measurement data reconstructed into image data, a heart-dependent coordinate system 43a, 43b can be determined. In this case the heart-dependent coordinate system 43a, 43b typically takes account of the position and/or the orientation and/or the spatial extent of the heart 41a, 41b, so that the heart-dependent coordinate system applies individually for the heart 41a, 41b of the examination object for precisely one examination.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring diagnostic measurement data of a heart of a patient, said method comprising:
    with a computer, operating a magnetic resonance (MR) data acquisition scanner in order to execute an MR control sequence comprising a radio-frequency (RF) pulse that excites nuclear spins in the heart of the patient with a flip angle of at least 60°, and to;
    with said computer, operating said MR data acquisition scanner in order to obtain an overview data acquisition of a patient;
    with said computer, acquiring diagnostic measurement data from the heart, in the execution of said MR control sequence, in a coordinate system that is independent of the heart, and making the acquired diagnostic measurement data in said coordinate system that is independent of the heart available from the computer in electronic form, as a data file;
    with said computer, acquiring said diagnostic measurement data from the heart using said overview data acquisition, in the execution of said MR control sequence, in a coordinate system that is independent of the heart; and
    while executing said MR control sequence, operating a basic field magnet of said MR data acquisition scanner in order to produce a basic magnetic field having a field strength that is smaller than 1.0 tesla;
    in said computer, reconstructing image data from said diagnostic measurement data;
    in said computer, determining a heart-dependent coordinate system based on said image data; and
    at a display screen in communication with said computer, presenting said image data in said heart-dependent coordinate system.

2. A method as claimed in claim 1 comprising, with said computer, operating said MR data acquisition scanner with a three-dimensional MR control sequence, as said MR control sequence.

3. A method as claimed in claim 1 comprising, with said computer, operating said MR data acquisition scanner with said MR control sequence in order to cause the excited nuclear spins in the heart to be in a steady state at a time at which said diagnostic measurement data are acquired.

4. A method as claimed in claim 1 comprising, with said computer, operating said MR data acquisition scanner in order to produce stimulated echoes, in said MR control sequence, that occur at a time at which said diagnostic measurement data are acquired.

5. A method as claimed in claim 1 comprising, with said computer, operating said MR data acquisition scanner to execute a steady state free precession SSFP MR control sequence, as said MR control sequence.

6. A method as claimed in claim 1 comprising, with said computer, operating said MR data acquisition scanner to execute a three-dimensional CINE control sequence, as said MR control sequence.

7. A method as claimed in claim 1 comprising acquiring said MR measurement data isotropically.

8. A method as claimed in claim 1 comprising, with said computer, entering the acquired diagnostic measurement data into a memory organized as k-space along a Cartesian trajectory.

9. A method as claimed in claim 1 comprising entering said diagnostic measurement data into a memory organized as k-space, and acquiring said MR diagnostic measurement data such that k-space is undersampled.

10. A method as claimed in claim 1 comprising acquiring said diagnostic measurement data in a time-resolved manner.

11. A method as claimed in claim 1 comprising allowing the patient to breathe freely while acquiring said diagnostic measurement data.

12. A method as claimed in claim 1 comprising acquiring said diagnostic measurement data with breath-triggering.

13. A method as claimed in claim 12 comprising implementing said breath-triggering as self-navigated breath triggering.

14. A method for acquiring diagnostic measurement data of a heart of a patient, said method comprising:
    with a computer, operating an magnetic resonance (MR) data acquisition scanner in order to execute an MR control sequence comprising a radio-frequency (RF) pulse that excites nuclear spins in the heart of the patient with a flip angle of at least 60°;
    with said computer, acquiring diagnostic measurement data from the heart, in the execution of said MR control sequence without administration of a contrast agent to the patient, in a coordinate system that is independent of the heart, and making the acquired diagnostic measurement data in said coordinate system that is independent of the heart available from the computer in electronic form, as a data file; and
    while executing said MR control sequence, operating a basic field magnet of said MR data acquisition scanner in order to produce a basic magnetic field having a field strength that is smaller than 1.0 tesla.

15. A magnetic resonance (MR) imaging apparatus comprising:
    an MR data acquisition scanner having a basic field magnet;
    a computer configured to operate said MR data acquisition scanner in order to execute an MR control sequence comprising a radio-frequency (RF) pulse that excites nuclear spins in the heart of the patient with a flip angle of at least 60°;
    said computer being configured to operate said MR data acquisition scanner in order to acquire diagnostic measurement data from the heart, in the execution of said MR control sequence, in a coordinate system that is independent of the heart, and make the acquired diagnostic measurement data in said coordinate system that is independent of the heart available from the computer in electronic form, as a data file;

said computer being configured to operate said MR data acquisition scanner in order to obtain an overview data acquisition of a patient;

said computer being configured to operate said MR data acquisition scanner in order to acquire said diagnostic measurement data from the heart dependent on said overview data acquisition, in the execution of said MR control sequence, in said coordinate system that is independent of the heart;

said computer being configured to operate the basic field magnet of said MR data acquisition scanner, while executing said MR control sequence, in order to produce a basic magnetic field having a field strength that is smaller than 1.0 tesla;

said computer being configured to reconstruct image data from said diagnostic measurement data;

said computer being configured to determine a heart-dependent coordinate system based on said image data; and a display screen in communication with said computer, said computer being configured to present said image data in said heart-dependent coordinate system at said display screen.

16. A non-transitory, computer-readable data storage medium encoded with programming instructions, said storage medium being loaded into a computer system of a magnetic resonance (MR) imaging system that has an MR data acquisition scanner comprising a basic field magnet, said programming instructions causing said computer system to:

operate the MR data acquisition scanner in order to execute an MR control sequence comprising a radio-frequency (RF) pulse that excites nuclear spins in the heart of a patient with a flip angle of at least 60°;

acquire diagnostic measurement data from the heart, in the execution of said MR control sequence without administration of a contrast agent to the patient, in a coordinate system that is independent of the heart, and make the acquired diagnostic measurement data in said coordinate system that is independent of the heart available from the computer in electronic form, as a data file; and while executing said MR control sequence, operate the basic field magnet of said MR data acquisition scanner in order to produce a basic magnetic field having a field strength that is smaller than 1.0 tesla.

17. A non-transitory, computer-readable data storage medium as claimed in claim 16, wherein said programming instructions also cause said computer system to:

operate the MR data acquisition scanner in order to obtain an overview data acquisition of a patient;

acquire diagnostic measurement data from the heart using said overview data acquisition, in the execution of said MR control sequence, in a coordinate system that is independent of the heart;

reconstruct image data from said diagnostic measurement data;

determine a heart-dependent coordinate system based on said image data; and at a display screen in communication with said computer, present said image data in said heart-dependent coordinate system.

* * * * *